US012808924B2

United States Patent

(12) United States Patent
Lin

(10) Patent No.: US 12,808,924 B2
(45) Date of Patent: Nov. 24, 2026

(54) FORCED EARLY FAILURE FOR MEMORY DEVICE

(71) Applicant: SMART Modular Technologies, Inc., Newark, CA (US)

(72) Inventor: Fong-Long Lin, Fremont, CA (US)

(73) Assignee: SMART Modular Technologies, Inc., Newark, CA (US)

( * ) Notice: Subject to any disclaimer, the term of this patent is extended or adjusted under 35 U.S.C. 154(b) by 444 days.

(21) Appl. No.: 18/389,379

(22) Filed: Nov. 14, 2023

(65) Prior Publication Data

US 2025/0155493 A1 May 15, 2025

(51) Int. Cl.

*G01R 31/10* (2006.01)
*G01R 31/28* (2006.01)
*G01R 31/3183* (2006.01)
*G01R 31/319* (2006.01)

(52) U.S. Cl.

CPC ... *G01R 31/2874* (2013.01); *G01R 31/31835* (2013.01); *G01R 31/31915* (2013.01)

(58) Field of Classification Search

CPC .......... G01R 31/2874; G01R 31/31835; G01R 31/31915; G11C 29/04; G11C 29/06; G11C 29/50

See application file for complete search history.

(56) References Cited

U.S. PATENT DOCUMENTS

2006/0154432 A1* 7/2006 Arai ........................ H10B 63/20 257/E29.33
2010/0112341 A1* 5/2010 Takagi .................. C03C 23/008 428/428
2012/0319296 A1* 12/2012 Tsumura ............ H10W 42/121 257/774
2015/0318222 A1* 11/2015 Matsumoto ........... H10P 74/207 702/81
2016/0225824 A1* 8/2016 Jo ........................ H10N 70/883
(Continued)

OTHER PUBLICATIONS

Chen, Z. et al., "Reliability of Wafer-Level Ultra-Thinning down to 3 μm using 20 nm-Node DRAMs," 2021 IEEE International Reliability Physics Symposium (IRPS), Mar. 21-25, 2021, Monterey, CA, USA, IEEE, 6 pages.
(Continued)

*Primary Examiner* — Thang X Le
(74) *Attorney, Agent, or Firm* — Withrow & Terranova, P.L.L.C.

(57) ABSTRACT

Systems and methods for forced early failure of cells within a memory device are disclosed. A memory device such as a dynamic random-access memory (DRAM) chip is subjected to an elevated temperature and an electric field to cause unwanted particles within the chip to migrate rapidly into the circuit elements of a memory cell, thereby causing the memory cell to fail. Subsequent testing may identify this failed cell and verify that the remaining cells within the memory device are operational. By forcing the cell to fail prior to certification testing, the end user may be reasonably confident that the certification provided for the device will remain accurate for the lifetime of the device. In contrast, without this forced early failure, such unwanted particles may migrate after deployment and may cause cell failure while deployed resulting in a botched operation.

10 Claims, 6 Drawing Sheets

(56) References Cited

U.S. PATENT DOCUMENTS

2022/0035535 A1 * 2/2022 Van De Graaff ... G11C 11/4076

OTHER PUBLICATIONS

Lee, K.-W. et al., "Impacts of 3-D integration processes on device reliabilities in thinned DRAM chip for 3-D DRAM," 2015 IEEE International Reliability Physics Symposium, Apr. 19-23, 2015, Monterey, CA, USA IEEE, 6 pages.

Pyun, J.W. et al., "The Effect of Cu Contamination on Device Reliability in DRAM," 2009 IEEE International Integrated Reliability Workshop Final Report, Oct. 18-22, 2009, South Lake Tahoe, CA, USA, IEEE, pp. 111-112.

* cited by examiner

FORCED EARLY FAILURE FOR MEMORY DEVICE

BACKGROUND

I. Field of the Disclosure

The technology of the disclosure relates generally to memory devices and a method to force failure of a memory device prior to integrity testing.

II. Background

Computing devices abound in modern society. The prevalence of these devices is driven in part by the many functions that are now enabled on such devices. Increased processing capabilities in such devices enable enhanced user experiences. With the advent of the myriad functions available to such devices, the size and complexity of the operating systems used to control the computing devices have increased. Likewise, there is a general trend for increasingly large and complex software applications. This increase in size and complexity requires more available memory to support the host processor. In general, most of the memory is volatile random-access memory (RAM).

As the scope of functionality increases, the demands placed on the memory increase. More specifically, a computationally intense, lengthy process (e.g., high-end graphics rendering, machine learning, or artificial intelligence training) may be compromised if the memory is defective or fails while the process is being executed. In extreme cases, it only takes a few failed memory cells in the memory device to cause the process to be compromised. Accordingly, there are now companies that sell certification services that certify that a memory device meets a predefined threshold of viable cells (and/or provides a map to avoid the use of failed cells). For example, the ZEFR™ service made available by the assignee of the present disclosure is one such service. Finding all the cells that have failed and/or are likely to fail after installation provides room for innovation.

SUMMARY

Aspects disclosed in the detailed description include systems and methods for forced early failure of cells within a memory device. In an exemplary aspect, a memory device such as a dynamic random-access memory (DRAM) chip is subjected to an elevated temperature and an electric field to cause unwanted particles within the chip to migrate rapidly into the circuit elements of a memory cell, thereby causing the memory cell to fail. Subsequent testing may identify this failed cell and verify that the remaining cells within the memory device are operational. By forcing the cell to fail prior to certification testing, the end user may be reasonably confident that the certification provided for the device will remain accurate for the lifetime of the device. In contrast, without this forced early failure, such unwanted particles may migrate after deployment and may cause cell failure while deployed, resulting in a botched operation.

In this regard, in one aspect, a method of forcing memory cell failure in a memory chip is disclosed. The method includes subjecting the memory chip having at least one memory cell to an elevated temperature for a predetermined amount of time sufficient to allow particles proximate or within the at least one memory cell to migrate to a vulnerable area.

In another aspect, a method of forcing memory cell failure in a memory chip is disclosed. The method includes applying an electrical field to the memory chip having at least one memory cell for sufficient time to allow particles proximate or within the memory cell to migrate to a vulnerable area.

In another aspect, a memory chip comprising a memory cell having a particle in a vulnerable area is disclosed, wherein the particle migrated to the vulnerable area after manufacturing as a result of the memory chip being exposed to an elevated temperature above 150 C and an electrical field.

DETAILED DESCRIPTION

Figure 1:
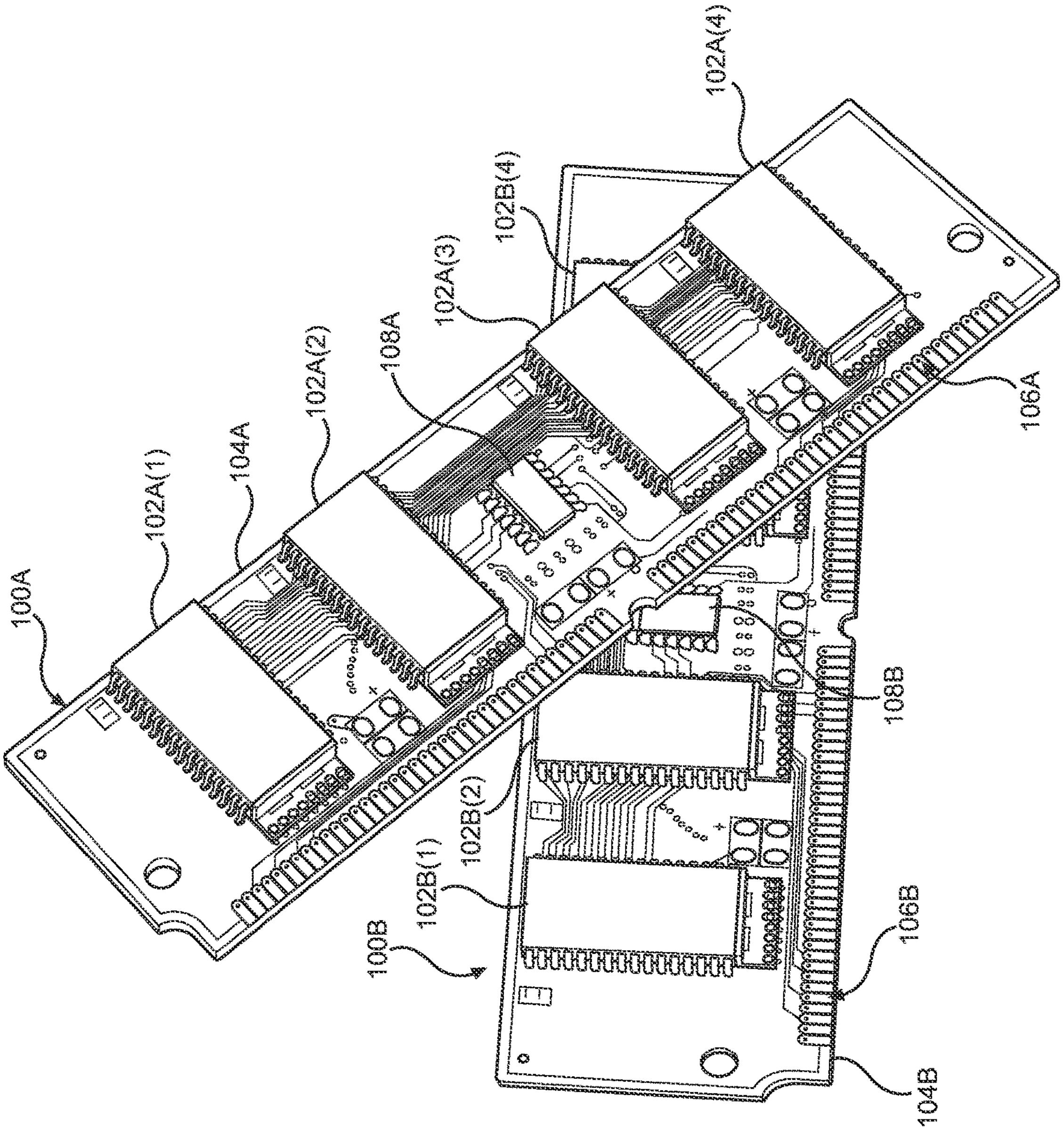
FIG. 1 is a top perspective view of a pair of memory devices and particularly two dynamic random-access memory (DRAM) sticks.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that although the terms first, second, etc. may be used herein to describe various elements, these elements should not be limited by these terms. These terms are only used to distinguish one element from another. For example, a first element could be termed a second element, and similarly, a second element could be termed a first element without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element, or intervening elements may also be present. In contrast, when an element is referred to as being "directly on" or extending "directly onto" another element, no intervening elements are present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, no intervening elements are present. It will also be understood that when an element is referred to as being "connected" or "coupled" to another element, it can be directly connected or coupled to the other element, or intervening elements may be present. In contrast, when an element is referred to as being "directly connected" or "directly coupled" to another element, no intervening elements are present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular aspects only and is not intended to be limiting of the disclosure. As used herein, the singular forms "a," "an," and "the" are intended to include the plural forms as well unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Aspects disclosed in the detailed description include systems and methods for forced early failure of cells within a memory device. In an exemplary aspect, a memory device such as a dynamic random-access memory (DRAM) chip is subjected to an elevated temperature and an electric field to cause unwanted particles within the chip to migrate rapidly into the circuit elements of a memory cell, thereby causing the memory cell to fail. Subsequent testing may identify this failed cell and verify that the remaining cells within the memory device are operational. By forcing the cell to fail prior to certification testing, the end user may be reasonably confident that the certification provided for the device will remain accurate for the lifetime of the device. In contrast, without this forced early failure, such unwanted particles may migrate after deployment and may cause cell failure while deployed, resulting in a botched operation.

Before addressing aspects of the present disclosure, a discussion of memory devices and sources of contamination is provided so that the discussion of the present disclosure has context. A discussion of aspects of the present disclosure begins below with reference to FIG. 3.

In this regard, FIG. 1 illustrates a pair of DRAM sticks 100A, 100B. Each stick 100A, 100B has respective memory chips 102A(1)-102A(4), 102B(1)-102B(4) positioned on a printed circuit board (PCB) material 104A, 104B. Conductors (shown, but not specifically labeled) connect the memory chips 102A(1)-102A(4), 102B(1)-102B(4) to input/output pads 106A, 106B. The configuration of I/O pads 106A, 106B conforms to a published form factor for memory devices as is well understood. Other elements such as capacitors C1-C4, a control circuit 108A, 108B, or the like may also be present on the sticks 100A, 100B.

Figure 2:
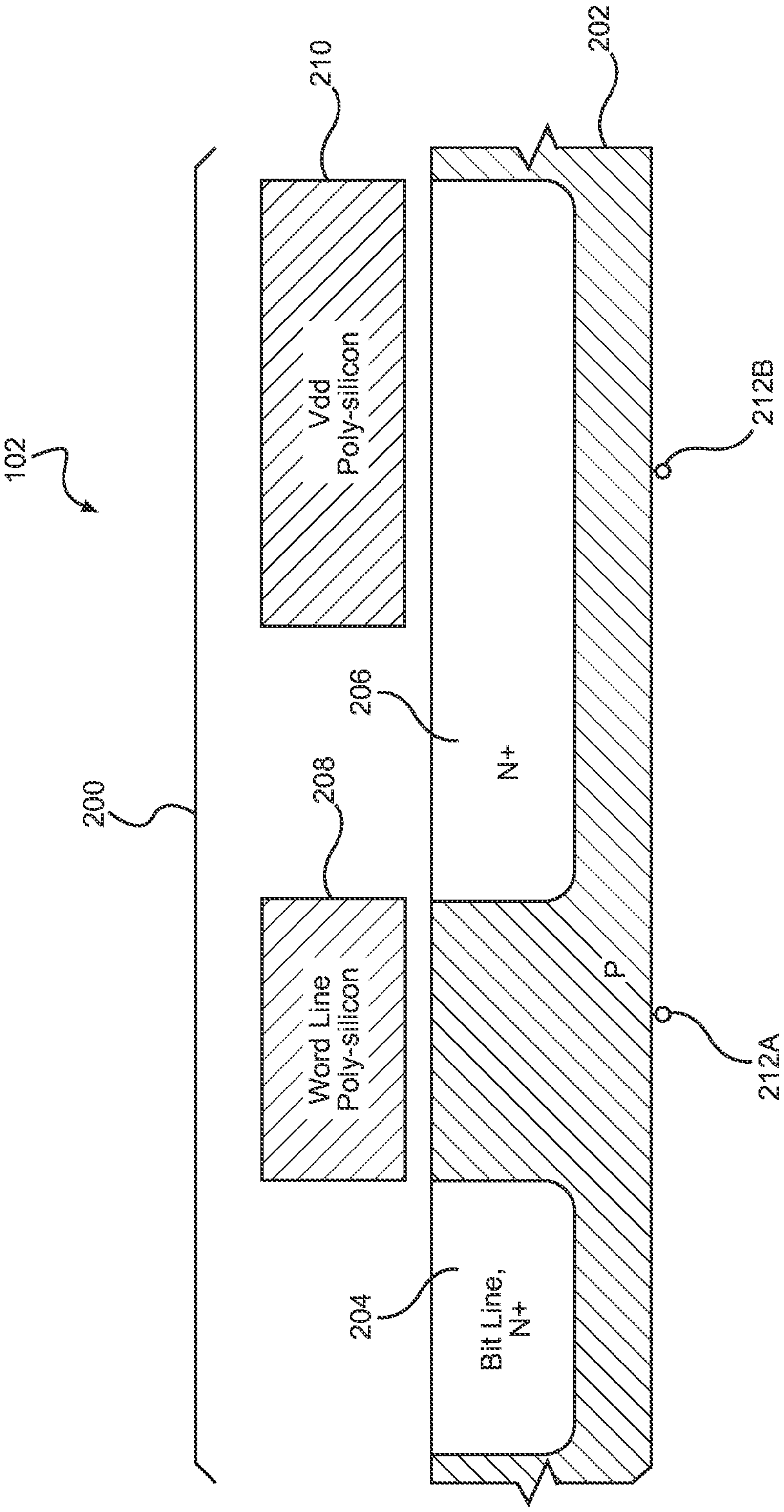
FIG. 2 is a simplified cross-sectional view of a memory cell within a DRAM device having an unwanted particle proximate to the memory cell.

Within a generic memory chip 102, a memory cell 200 is positioned, as shown in FIG. 2. The memory cell 200 may include a substrate 202, a bit line section 204 formed from a doped portion of the substrate 202, another doped section 206, a word line 208, and a voltage input 210. Variations on the structure of a memory cell 200 have existed at least since the first DRAM patent in 1968, and the precise structure is not central to the present disclosure.

Regardless of the specific structure, during manufacturing, there may be extraneous material that adheres to or is inadvertently left on the memory cell 200. For example, during back grinding of the wafer (i.e., the substrate 202), copper particles 212A or 212B may remain on a surface of the substrate 202. When located outside the substrate 202, operation of the memory cell 200 may occur unimpeded. However, over time, the copper particles 212A, 212B may migrate into the substrate 202 and even into a doped section 204, 206. The presence of a copper particle 212A, 212B in the doped sections 204, 206 (and potentially even in the substrate 202) may change the operation of the memory cell 200 and result in the memory cell 200 being considered failed.

In general, there are thousands of memory cells 200 in a given memory chip 102. Thus, the failure of a given memory cell 200 does not specifically impact the overall utility of the memory chip 102. However, if the memory cell 200 fails while the memory chip 102 is in use (e.g., by a host processor (not shown)), and particularly if the memory cell 200 fails while a bit being used by an executing process is stored therein, such failure may interrupt or otherwise interfere with the executing process. Because such failure is a result of relatively slow migration (i.e., after the memory chip 102 has been in use for some time), a memory chip 102 may experience memory cell failure after that particular memory cell has been certified as valid. Failure of a certified memory cell reduces trust in the certification process as well as inconveniences the end user.

Accordingly, there is an interest in improving the ability to detect such potential future failures. Exemplary aspects of the present disclosure provide one such improvement by forcing premature failure of memory cells that are susceptible to such migration-based failures. In particular, aspects of the present disclosure accelerate the migration of such particles through the use of applied temperature and electric fields. When a memory chip 102 is subjected to such conditions, particles that may exist are more likely to migrate to a vulnerable portion of a memory cell 200 and cause a failure that can be detected by a certification process. As noted, the known failure of a given cell before deployment is readily handled compared to a cell that may fail during an executing process.

Figure 3:
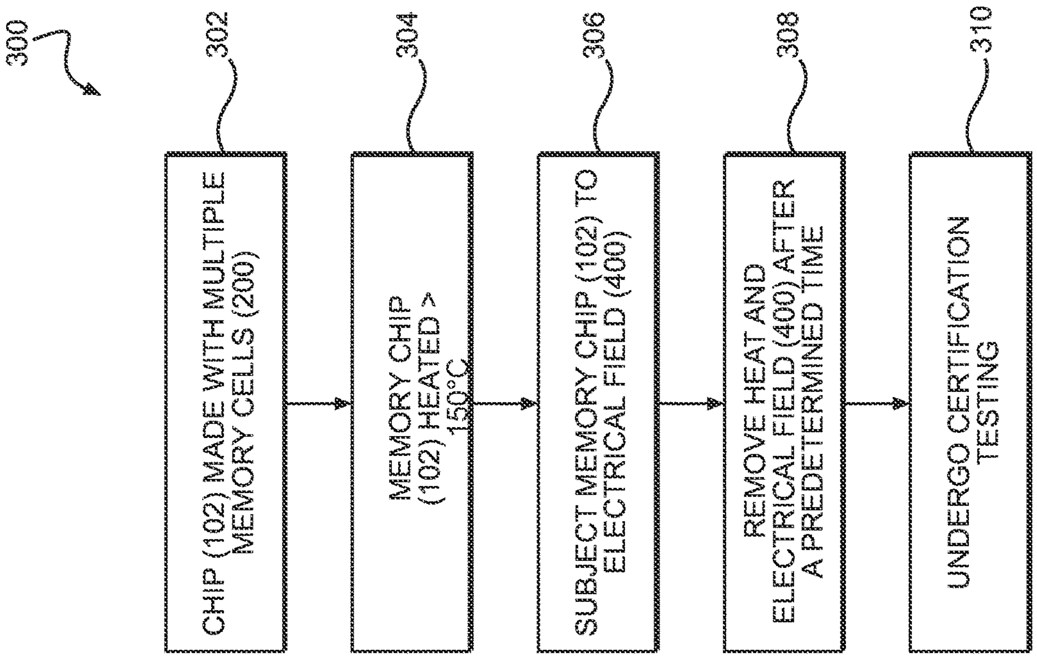
FIG. 3 is a flowchart of a process for forcing early failure of the memory cell according to exemplary aspects of the present disclosure.

A process 300 for forced failure is set forth in FIG. 3. Specifically, a chip 102 is made having multiple memory cells 200 therein (block 302). During this manufacturing process, one or more cells 200 may have extraneous particles embedded, adjacent to, or otherwise proximate to the memory cell 200. The presence and location of such particles are not known and are only generally predictable (e.g., copper particles on a lower surface from back grinding). The memory chip 102 is heated to a temperature above 150 C (block 304). The precise temperature may vary depending on the materials of the memory chip 102 and the composition of likely particles but should not destructively affect the memory chip 102 (e.g., no solder reflow or the like). Thus, the temperature should be elevated to accelerate the failure within a reasonable amount of time and without degrading or damaging the device. As such, the highest temperature that does not damage or degrade the chip 102 may be used. Raising the temperature in this fashion makes it easier for particles to migrate within the memory cell 200.

Figure 4A:
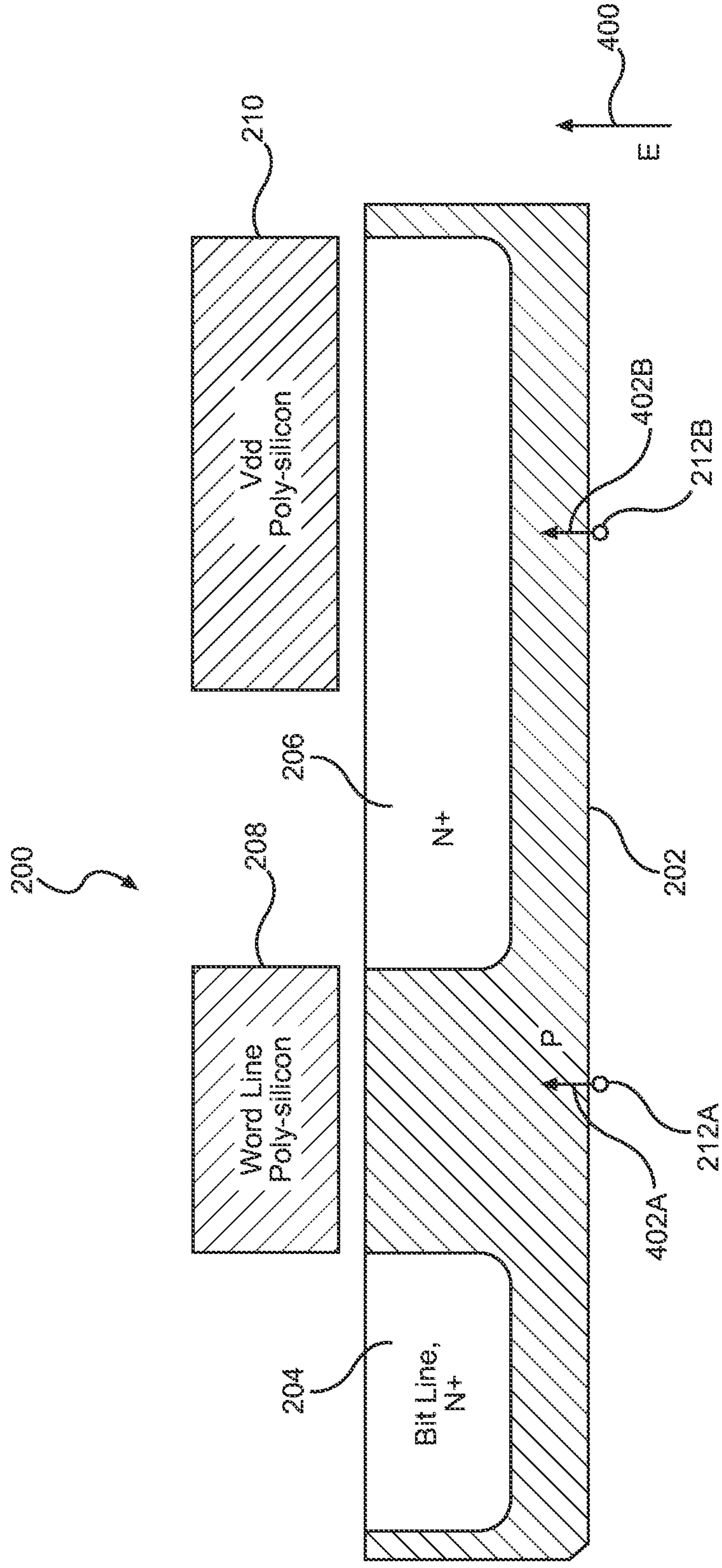
FIGS. 4A and 4B provide cross-sectional views of a DRAM cell as various steps of the process of FIG. 3 are performed.

The memory chip 102 is then subjected to an electrical field 400 (block 306). The direction of the field may be based on the expected ionization of the particle and a desired direction of migration (e.g., a copper particle is likely a positive charge, and the desire is to move the particle into the doped sections, so a field that would move a positive ion in that direction is applied, with the understanding that there may be negatively charged particles and as such, aspects of the present disclosure contemplate using both positive and negative electrical fields to move the particles). As illustrated in FIG. 4A, the particles 212A and 212B have entered the substrate 202 (shown generally by arrows 402A, 402B, respectively) after application of the electrical field 400. Note that some migration will occur when the temperature is raised, but such migration is not directed and may not result in moving the particles to a vulnerable portion of the memory cell 200. Likewise, while an electrical field may get some movement, without the temperature being raised, such movement is impeded.

Figure 4B:
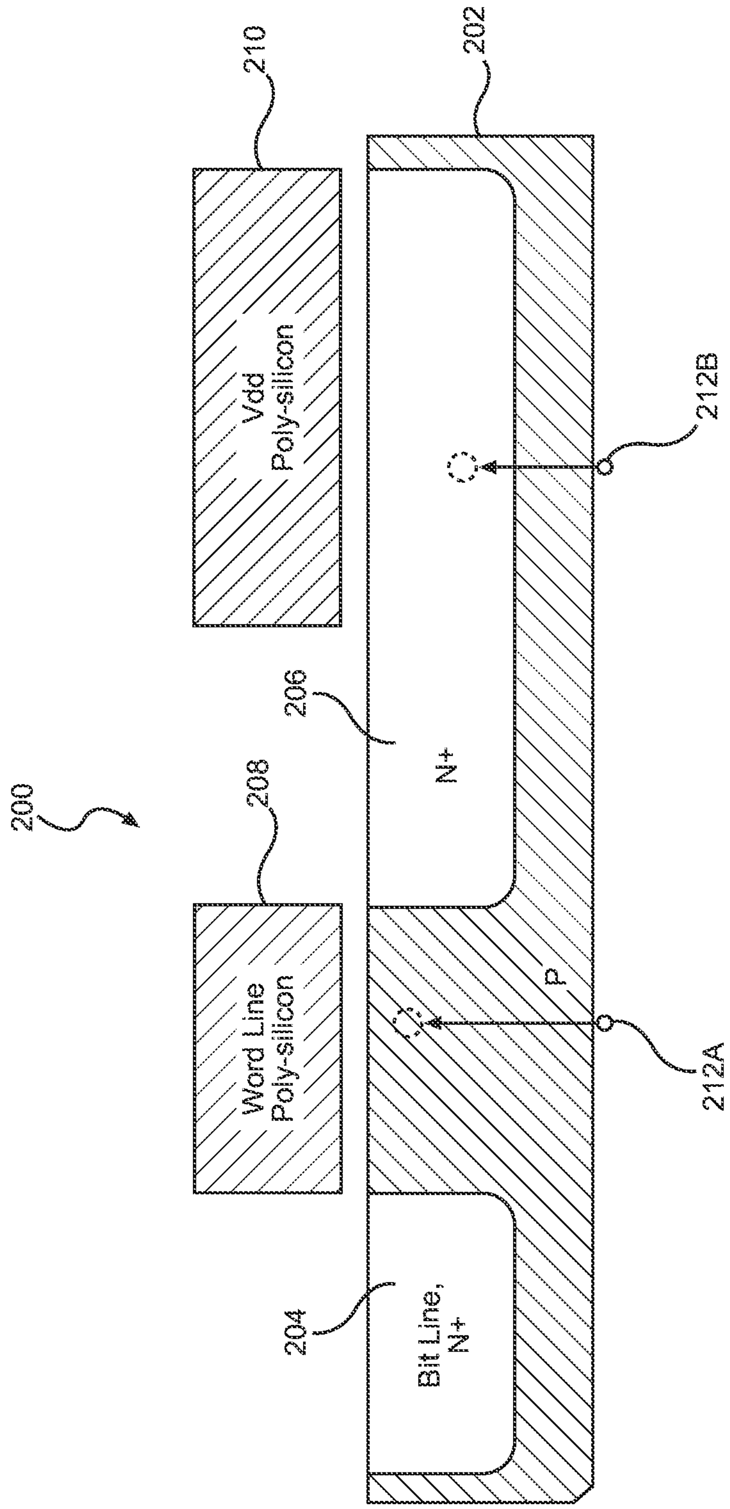

Remove heat and electrical field 400 after a predetermined amount of time (block 308). At this point, the particles 212A, 212B will have migrated to the vulnerable portions of the memory cell 200 (i.e., the doped sections 204, 206), as shown in FIG. 4B. The amount of time will depend on the size of the memory cell, materials, and the likely composition of the particles of interest. Such time may be determined empirically.

After the forced migration, the memory chip 102 may undergo certification testing (block 310) to see what memory cells 200 have failed. With this identification, a reliable memory device may be used by the end user.

Figure 5:
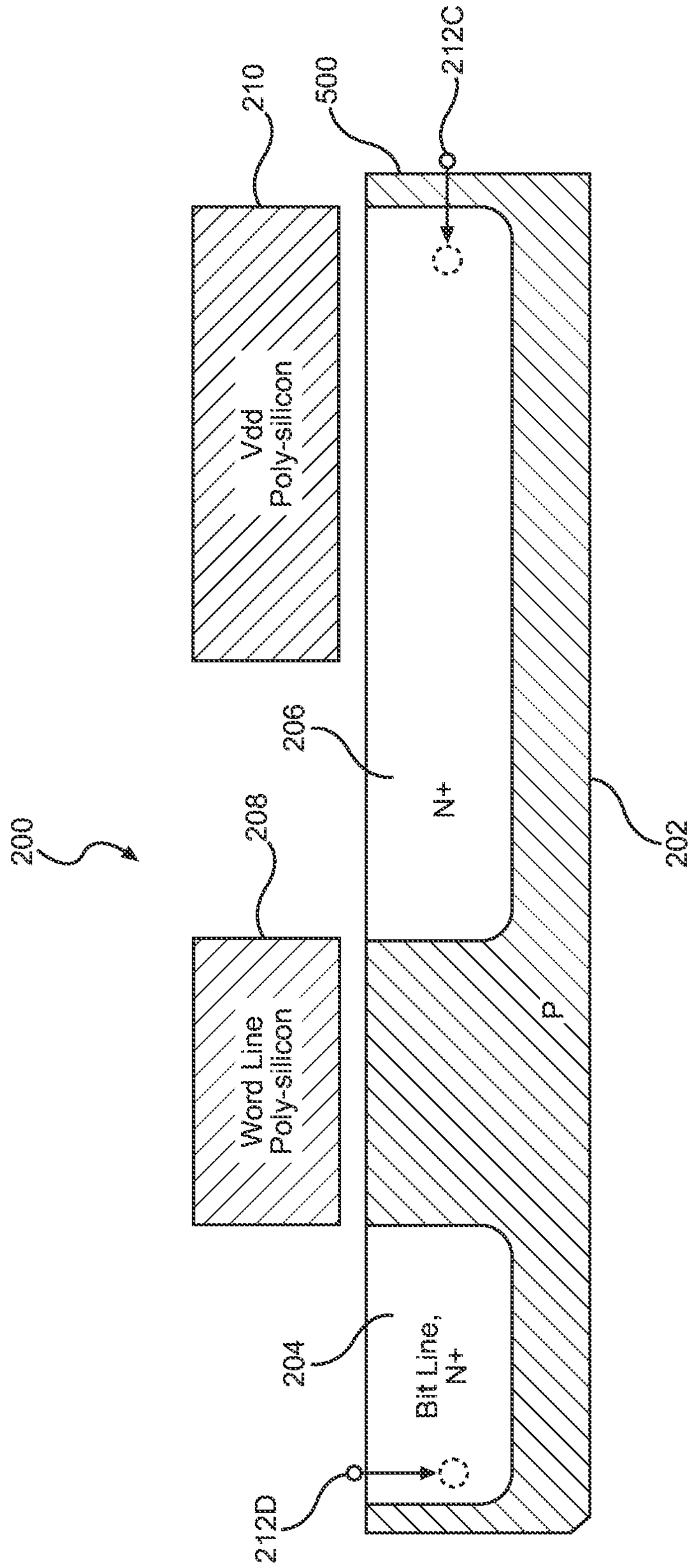
FIG. 5 provides a cross-sectional view of a DRAM cell with different sorts of unwanted particles that may be manipulated to force early failure of the cell according to exemplary aspects of the present disclosure.

It should be appreciated that the type of particle may be different. For example, the particle could be a bit of solder material from die attaching, a bit of mold compound, or the like. Likewise, the particles may not be on the bottom surface as illustrated in FIG. 2, but rather, as illustrated in FIG. 5, a particle 212C may be on a side surface 500, or a particle 212D may be on a top surface 502. Such possible placement may mean that the orientation of the electrical field 400 (not shown in FIG. 5) may be changed to cause migration into the vulnerable areas of the memory cell 200.

In any event, a final memory chip 102 has memory cells 200 that has had particles forcibly migrated into vulnerable areas such that the memory cell 200 fails. The purposeful failure is used to improve the quality of certification testing and capture as failed cells those cells that might pass certification at manufacturing but fail sometime after deployment from the migration of extraneous particles.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flowchart diagrams may be subject to numerous different modifications, as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations. Thus, the disclosure is not intended to be limited to the examples and designs described herein but is to be accorded the widest scope consistent with the principles and novel features disclosed herein.

What is claimed is:

1. A method of forcing memory cell failure in a memory chip, comprising:

prior to a certification test, subjecting the memory chip having at least one memory cell to an elevated temperature for a predetermined amount of time sufficient to allow particles proximate or within the at least one memory cell to migrate to a vulnerable area such that the at least one memory cell fails;

testing the at least one memory cell for viability after removing the memory chip from the elevated temperature;

designating the at least one memory cell as failed after testing;

certifying reliable memory cells in the memory chip that passed the testing.

2. The method of claim 1, wherein subjecting the memory chip to the elevated temperature comprises subjecting the memory chip to a temperature above 150 C.

3. The method of claim 1, further comprising, while subjecting the memory chip to the elevated temperature, concurrently applying an electrical field to the memory chip.

4. The method of claim 3, wherein the electrical field is oriented so as to drive a positive ion in a first location towards the vulnerable area.

5. The method of claim 3, wherein the electrical field is oriented so as to drive a copper particle towards a doped section of a substrate in the at least one memory cell.

6. The method of claim 3, wherein the electrical field is oriented to drive a mold compound particle on a side wall of the at least one memory cell to the vulnerable area.

7. A method of forcing memory cell failure in a memory chip, comprising:

prior to a certification test, applying an electrical field to the memory chip having at least one memory cell for sufficient time to allow particles proximate or within the memory cell to migrate to a vulnerable area such that the at least one memory cell fails;

testing the at least one memory cell for viability after removing the memory chip from the electrical field;

designating the at least one memory cell as failed after testing;

certifying reliable memory cells in the memory chip that passed the testing.

8. The method of claim 7, further comprising, while applying the electrical field, subjecting the memory chip to a temperature above 150 C.

9. The method of claim 8, wherein the particles comprise at least one copper particle.

10. A memory chip comprising a memory cell having a particle in a vulnerable area, wherein the particle migrated to the vulnerable area after manufacturing as a result of the memory chip being exposed to an elevated temperature above 150 C and an electrical field; and wherein the memory cell is designated as failed in a certification process responsive to failure from the elevated temperature and electrical field.

* * * * *